US005373228A

United States Patent [19]

Holle

[11] Patent Number: 5,373,228

[45] Date of Patent: Dec. 13, 1994

[54] INTEGRATED CIRCUIT HAVING A CASCODE CURRENT MIRROR

[75] Inventor: Eerke Holle, Eindhoven, Netherlands

[73] Assignee: U.S. Philips Corporation, New York, N.Y.

[21] Appl. No.: 197,435

[22] Filed: Feb. 14, 1994

[30] Foreign Application Priority Data

Feb. 12, 1993 [EP] European Pat. Off. ........ 93200380.9

[51] Int. Cl.[5] ........................... G05F 3/16; H03F 3/04

[52] U.S. Cl. .................................... 323/315; 323/316; 330/288

[58] Field of Search ........................ 323/312, 315, 316; 307/296.1, 296.6; 330/288, 296, 310

[56] References Cited

U.S. PATENT DOCUMENTS 4,477,782 10/1984 Swanson ............................. 330/288
4,550,284 10/1985 Sooch ............................... 323/315
4,618,815 10/1986 Swanson ............................. 323/315
4,866,368 9/1989 Bird .................................. 323/316
4,983,929 1/1991 Real et al. ........................... 330/288
5,311,115 5/1994 Archer ............................... 323/315

*Primary Examiner*—Steven L. Stephan
*Assistant Examiner*—Matthew Nguyen
*Attorney, Agent, or Firm*—Steven R. Biren

[57] ABSTRACT

An integrated circuit comprising a cascode current mirror and a bias stage for biassing the cascode current mirror, the cascode current mirror comprising, between an input terminal (11) and a supply voltage terminal (14), a first cascoded MOS transistor (21) and a first cascode MOS transistor (22) and, between an output terminal (12) and the supply voltage terminal (14), a second cascoded MOS transistor (23) and a second cascode MOS transistor (24). In order to obtain a minimal voltage between the output terminal (12) and the supply voltage terminal (14) the bias stage comprises a first bias current source (31) for generating a first bias current, a second bias current source (32) for generating a second bias current, a first bias MOS transistor (41) having a gate coupled to the gates of the two cascoded MOS transistors (21, 23), a source, and a drain coupled to the first supply voltage terminal (13) via the first bias current source (31), a second bias MOS transistor (42) having a gate coupled to the gates of the two cascode MOS transistors (22, 24), a source coupled to the source of the first bias MOS transistor (41), and a drain coupled to the first supply voltage terminal (13) via the second bias current source (32), and a third bias MOS transistor (43) coupled between the sources of the two bias MOS transistors (41, 42) and the second supply voltage terminal (14).

3 Claims, 1 Drawing Sheet

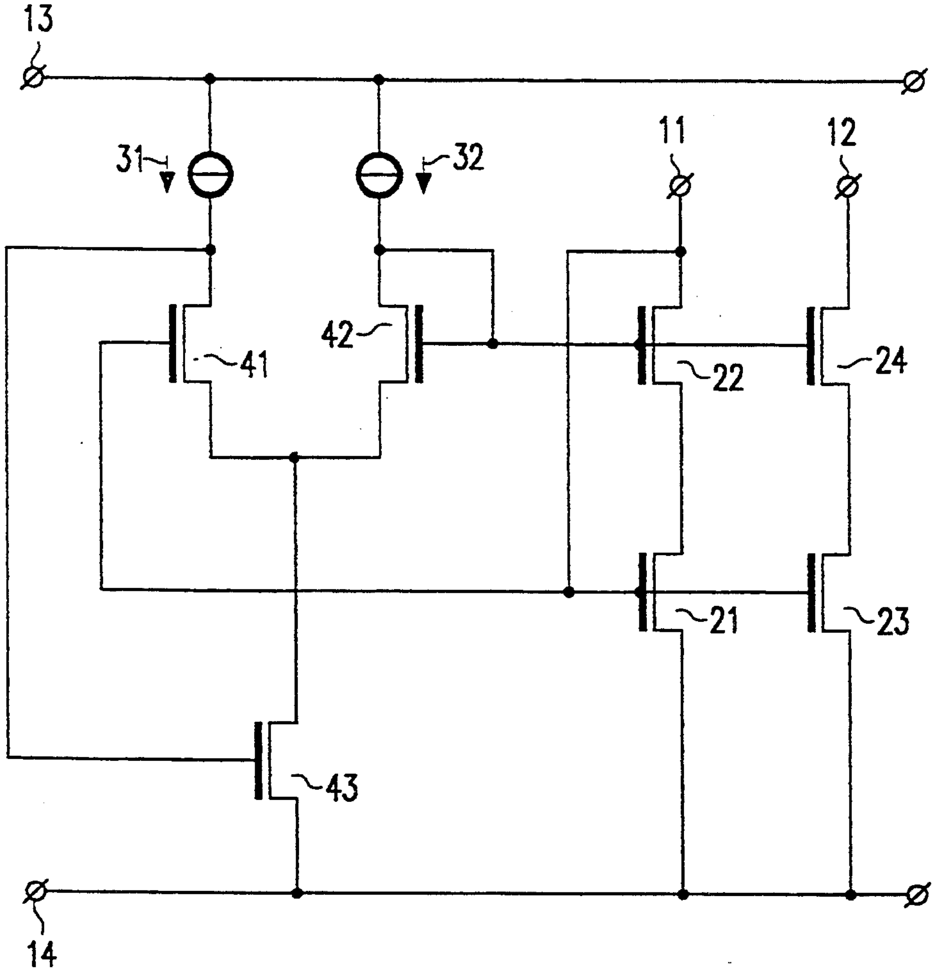
13
31
32
11
12
42
41
22
24
21
23
43
14

INTEGRATED CIRCUIT HAVING A CASCODE CURRENT MIRROR

BACKGROUND OF THE INVENTION

The invention relates to an integrated circuit comprising a cascode current mirror, a bias stage for biassing the cascode current mirror, a first supply voltage terminal for receiving a first supply voltage, and a second supply voltage terminal for receiving a second supply voltage, the cascode current mirror having an input terminal for receiving an input current, an output terminal for supplying an output current, a first cascoded MOS transistor having a gate coupled to the input terminal, a source coupled to the supply voltage terminal, and a drain, a first cascode MOS transistor having a gate coupled to the bias stage, a source coupled to the drain of the first cascoded MOS transistor, and a drain coupled to the input terminal, a second cascoded MOS transistor having a gate coupled to the gate of the first cascoded MOS transistor, a source coupled to the source of the MOS transistor 21, and a drain, and a second cascode MOS transistor having a gate coupled to the gate of the first cascode MOS transistor, a source coupled to the drain of the second cascoded MOS transistor, and a drain coupled to the output terminal.

Such an integrated circuit, which converts an input current into an output current by means of a cascode current mirror, can be utilized in a diversity of chips.

Such an integrated circuit is known inter alia from U.S. Pat. No. 4,618,815. In the known integrated circuit the bias stage comprises a current source and a MOS transistor coupled as a diode. Since the current source and the MOS transistor are serially coupled between the two supply voltage terminals a current generated by the current source produces a voltage across the MOS transistor, which voltage is applied between the gates of the two cascode MOS transistors and the second supply voltage terminal. As a result of the voltage the two cascode MOS transistors and, indirectly, the two cascoded MOS transistors are biassed, which two cascoded MOS transistors should be operated in a saturation mode in order to ensure an undistorted current transfer of the cascode current mirror. Since the cascoded MOS transistors have a drain-source voltage which varies depending upon a current through the two cascoded MOS transistors, the voltage between the gates of the two cascode MOS transistors and the second supply voltage terminal should have value which guarantees saturation of the cascoded MOS transistors. As a result, the value of the voltage between the gates of the two cascode MOS transistors and the second supply voltage terminal should exhibit a margin to cope with a variation of the drain-source voltage.

A disadvantage of such an integrated circuit is that the output voltage between the first supply voltage terminal and the output terminal is comparatively small owing to the margin.

SUMMARY OF THE INVENTION

It is an object of the invention to provide an integrated circuit which (for a minimal supply voltage difference) guarantees a comparatively large output voltage (relative to the minimal supply voltage difference) between the first supply voltage terminal and the output terminal.

An integrated circuit in accordance with the invention is characterized in that the bias stage comprises a first bias current source for generating a first bias current, a second bias current source for generating a second bias current, a first bias MOS transistor having a gate coupled to the gates of the two cascoded MOS transistors, a source, and a drain coupled to the first supply voltage terminal via the first bias current source, a second bias MOS transistor having a gate coupled to the gates of the two cascode MOS transistors, a source coupled to the source of the first bias MOS transistor, and a drain coupled to the first supply voltage terminal via the second bias current source, and a third bias MOS transistor coupled between the sources of the two bias MOS transistors and the second supply voltage terminal. The invention is based on the recognition of the fact that the cascode MOS transistors should be biassed with a voltage which depends on the current through the cascoded MOS transistors. In the integrated circuit in accordance with the invention this is achieved in that the gates of the cascoded MOS transistors are coupled to the gates of the cascode MOS transistors via the first and the second bias MOS transistor, which bias MOS transistors form a differential amplifier. As a result, a voltage (a difference) can be applied between the gates of the cascoded MOS transistors and the cascode MOS transistors, which voltage biasses the two cascode MOS transistors and, indirectly, the two cascoded MOS transistors and tracks a variation of the drain-source voltage (the current) of the two cascoded MOS transistors. Since the voltage keeps in track no voltage margin is required and a comparatively large output voltage is obtained.

A further embodiment of an integrated circuit in accordance with the invention is characterized in that the gate of the second bias MOS transistor is coupled to the drain of the second bias MOS transistor. When the second bias MOS transistor is thus coupled as a diode the second bias MOS transistor can receive the bias current generated by the second bias current source, the second bias MOS transistor having a gate-source voltage dictated by the bias current, by means of which gate-source voltage the cascoded and the cascode MOS transistors can be biased.

A further embodiment of an integrated circuit in accordance with the invention is characterized in that the third bias MOS transistor has a gate coupled to the drain of the first bias MOS transistor, a source coupled to the second supply voltage terminal, and a drain coupled to the sources of the first and the second bias MOS transistor. When the third bias MOS transistor is coupled in this way the first bias MOS transistor can receive the bias current generated by the first bias current source, the first bias MOS transistor having a gate-source voltage dictated by the bias current and the current through the third bias MOS transistor being dictated by the first and the second bias current source. If the gate-source voltages of the first and the second bias MOS transistor exhibit a difference corresponding to the drain-source voltage of a MOS transistor in the saturation mode the cascode and the cascoded MOS transistors will be biassed in such a way that the output voltage is comparatively large. The difference can be obtained by means of a difference in the bias currents from the respective current sources and/or by means of a specific matching of the respective bias MOS transistors.

BRIEF DESCRIPTION OF DRAWING

The above and other (more detailed) aspects of the invention will now be described and elaborated with reference to the accompanying Figure, which Figure shows an integrated circuit embodying the invention.

DETAIL DESCRIPTION OF THE INVENTION

The accompanying Figure shows an integrated circuit embodying the invention. The embodiment, similarly to the prior art, comprises a cascode current mirror (11, 12, 21, 22, 23, 24), a bias stage (31, 32, 41, 42, 43) for biassing the cascode current mirror, a first supply voltage terminal 13 for receiving a first supply voltage, and a second supply voltage terminal 14 for receiving a second supply voltage, the relevant current mirror having an input terminal 11 for receiving an input current, an output terminal 12 for supplying an output current, a first cascoded MOS transistor 21 having a gate coupled to the input terminal 11, a source coupled to the supply voltage terminal 14, and a drain, a first cascode MOS transistor 22 having a gate coupled to the bias stage, a source coupled to the drain of the MOS transistor 21, and a drain coupled to the input terminal 11, a second cascoded MOS transistor 23 having a gate coupled to the gate of the MOS transistor 21, a source coupled to the source of the MOS transistor 21, and a drain, and a second cascode MOS transistor 24 having a gate coupled to the gate of the MOS transistor 22, a source coupled to the drain of the MOS transistor 23, and a drain coupled to the output terminal 12. In accordance with the invention the bias stage comprises a first bias current source 31 for generating a first bias current, a second bias current source 32 for generating a second bias current, a first bias MOS transistor 41 having a gate coupled to the gates of the MOS transistors 21 and 23, a source, and a drain coupled to the supply voltage terminal 13 via the bias current source 31, a second bias MOS transistor 42 having a gate coupled to the gates of the MOS transistors 22 and 24, a source coupled to the source of the MOS transistor 41, and a drain coupled to the supply voltage terminal 13 via the bias current source 32 and to the gate of the MOS transistor 42, and a third bias MOS transistor 43 having a gate coupled to the drain of the MOS transistor 41, a source coupled to the supply voltage terminal 14, and a drain coupled to the sources of the MOS transistors 41 and 42.

Since the gates of the MOS transistors 21 and 23 are coupled to the gates of the MOS transistors 22 and 24 via the MOS transistors 41 and 42, which MOS transistors form a differential amplifier, the bias stage (31, 32, 41, 42, 43) produces, in accordance with the invention, a voltage between the gates of the MOS transistors 21 and 23 and the gates of the MOS transistors 22 and 24, by means of which voltage the MOS transistors 21.22, 23 and 24 can be biassed and the MOS transistors 21 and 23 can be maintained in a saturation mode for an undistorted current transistor of the cascode current mirror. The voltage is obtained by means of the MOS transistor 41, whose gate-source voltage is determined by the first bias current, and by means of the MOS transistor 42, whose gate-source voltage is determined by the second bias current. Since the gate-source voltages of the MOS transistors 41 and 42 are coupled in series opposition the voltage is a voltage difference. If the difference corresponds to the drain-source voltage of a MOS transistor in the saturation mode the MOS transistors 21, 22, 23 and 24 are biassed in such a manner that the output voltage is and remains comparatively large. The difference can be obtained by means of a difference in the bias currents from the bias current sources 31 and 32 and/or by means of a specific matching of the MOS transistors 41 and 42. When the bias currents are selected to be equal and the MOS transistors 41 and 42 are given width-length ratios such that the width-length ratio of the MOS transistor 41 is a factor of four larger than the width-length ratio of the MOS transistor 42, a very large output voltage is obtained. The relevant output voltage is obtained in that the voltage (difference) for said factor has a value equal to the drain-source voltage of a MOS transistor in the saturation mode. This results in a single gate-source voltage between the gates of the MOS transistors 21 and 23 and the supply voltage terminal 14, in a single gate-source voltage plus a single drain-source voltage of a saturated MOS transistor between the gates of the MOS transistors 22 and 24, and in two drain-source voltages between the output terminal 12 and the supply voltage terminal 14, without a margin. Although the MOS transistors 21 and 23 have a drain-source voltage which varies depending on a current through the MOS transistors, the setting (the difference and the saturation mode) of the MOS transistors 21 and 23 does not change because the voltage between the gates of the MOS transistors 22 and 24 and the gates of the MOS transistors 21 and 23 tracks a variation of the current. This results in an output voltage between the supply voltage terminal 13 and the output terminal 12, which output voltage is and remains very large.

In addition to the favourable output voltage the integrated circuit in accordance with the invention has an accurate mirror ratio. The accurate mirror ratio results from the bias stage, in which bias stage the MOS transistors 42 and 43 bias the MOS transistors 22 and 24, the MOS transistors 22, 24 and 42 having a threshold voltage with a similar body effect. The similar body effect is obtained as a result of the MOS transistor 43, which couples the MOS transistor 42 to the supply voltage terminal 14, in a manner similar to the MOS transistors 21 and 23 relative to the MOS transistors 22 and 24.

A further advantage of the integrated circuit in accordance with the invention is that a supply voltage can be applied to the supply voltage terminals 13 and 14, which supply voltage has a minimum value of a single gate-source voltage (the MOS transistor 42) and two drain-source voltages (the MOS transistor 43 and the bias current source 32).

The invention is not limited to the embodiment shown herein. Within the scope of the invention several modifications are conceivable to those skilled in the art. A possible modification concerns the implementation of the current mirror. When a further cascoded MOS transistor and a further cascode MOS transistor are added to the current mirror shown, the further cascoded MOS transistor and the further cascode MOS transistor being coupled parallel to the second cascoded MOS transistor and the second cascode MOS transistor, the resulting current mirror will supply a further output current in addition to the said output current. A further modification concerns the implementation of the bias stage. Although the bias stage shown herein comprises the first and the second bias current source and the first, the second and the third bias MOS transistor, the relevant bias stage requires only a first gate-source voltage and a second gate-source voltage, which gate-source voltages are coupled in series opposition between the gates of the cascoded MOS transistors and the gates of the cascode MOS transistors. With respect to the gate-source voltages the resulting bias stage can be constructed in a variety ways. With an equal width-length ratio of the first and the second bias MOS transistor the first bias current source can, for example, be constructed to generate a first bias current which is a factor of four smaller than the second bias current generated by the second current source. Conversely, the first bias current source can be dispensed with if the third bias MOS transistor generates a constant current related to the second bias current generated by the second bias current source.

I claim:

1. An integrated circuit comprising a cascode current mirror, a bias stage for biassing the cascode current mirror, a first supply voltage terminal (13) for receiving a first supply voltage, and a second supply voltage terminal (14) for receiving a second supply voltage, the cascode current mirror having an input terminal (11) for receiving an input current, an output terminal (12) for supplying an output current, a first cascoded MOS transistor (21) having a gate coupled to the input terminal (11), a source coupled to the supply voltage terminal (14), and a drain, a first cascode MOS transistor (22) having a gate coupled to the bias stage, a source coupled to the drain of the first cascoded MOS transistor (21), and a drain coupled to the input terminal (11), a second cascoded MOS transistor (23) having a gate coupled to the gate of the first cascoded MOS transistor (21), a source coupled to the source of the MOS transistor (21), and a drain, and a second cascode MOS transistor (24) having a gate coupled to the gate of the first cascode MOS transistor (22), a source coupled to the drain of the second cascoded MOS transistor (23), and a drain coupled to the output terminal (12), characterized in that the bias stage comprises a first bias current source (31) for generating a first bias current, a second bias current source (32) for generating a second bias current, a first bias MOS transistor (41) having a gate coupled to the gates of the two cascoded MOS transistors (21, 23), a source, and a drain coupled to the first supply voltage terminal (13) via the first bias current source (31), a second bias MOS transistor (42) having a gate coupled to the gates of the two cascode MOS transistors (22, 24), a source coupled to the source of the first bias MOS transistor (41), and a drain coupled to the first supply voltage terminal (13) via the second bias current source (32), and a third bias MOS transistor (43) coupled between the sources of the two bias MOS transistors (41, 42) and the second supply voltage terminal (14).

2. An integrated circuit as claimed in claim 1, characterized in that the gate of the second bias MOS transistor (42) is coupled to the drain of the second bias MOS transistor (42).

3. An integrated circuit as claimed in claim 1, characterized in that the third bias MOS transistor (43) has a gate coupled to the drain of the first bias MOS transistor (41), a source coupled to the second supply voltage terminal (14), and a drain coupled to the sources of the first and the second bias MOS transistor (41, 42).

* * * * *